US011526090B2

(12) United States Patent
Tsutsumi

(10) Patent No.: US 11,526,090 B2
(45) Date of Patent: Dec. 13, 2022

(54) IMPRINT APPARATUS AND METHOD OF MANUFACTURING ARTICLE

(71) Applicant: CANON KABUSHIKI KAISHA, Tokyo (JP)

(72) Inventor: Ryosuke Tsutsumi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 43 days.

(21) Appl. No.: 16/794,548

(22) Filed: Feb. 19, 2020

(65) Prior Publication Data

US 2020/0285159 A1 Sep. 10, 2020

(30) Foreign Application Priority Data

Mar. 4, 2019 (JP) .............................. JP2019-038762

(51) Int. Cl.
*G03F 9/00* (2006.01)
*G03F 7/20* (2006.01)
*G03F 7/00* (2006.01)
*B29C 31/04* (2006.01)
*B29C 37/00* (2006.01)

(52) U.S. Cl.
CPC .......... *G03F 9/7042* (2013.01); *B29C 31/044* (2013.01); *G03F 7/0002* (2013.01); *G03F 7/20* (2013.01); *G03F 9/7023* (2013.01); *B29C 2037/90* (2013.01)

(58) Field of Classification Search
CPC ........................... B29C 31/044; B29C 2037/90
See application file for complete search history.

(56) References Cited

U.S. PATENT DOCUMENTS

| | | | |
|---|---|---|---|
| 2002/0044168 A1* | 4/2002 | Hashi | B41J 11/007 347/32 |
| 2010/0245477 A1* | 9/2010 | Ohkubo | B41J 2/14233 347/47 |

(Continued)

FOREIGN PATENT DOCUMENTS

| | | |
|---|---|---|
| JP | 2012-069758 A | 4/2012 |
| JP | 5563319 B2 | 7/2014 |

OTHER PUBLICATIONS

Notice of Reasons for Refusal issued in corresponding JP Patent Application No. 2019-038762, dated Oct. 3, 2022, pp. 1-5, with English translation.

*Primary Examiner* — Galen H Hauth
(74) *Attorney, Agent, or Firm* — Carter, DeLuca & Farrell LLP

(57) ABSTRACT

The present invention provides an imprint apparatus that forms an imprint material pattern on a substrate by using a mold, comprising: a discharge unit on which a plurality of discharge outlets configured to discharge an imprint material are arranged; a measurement unit configured to measure a relative tilt between the discharge unit and the substrate; and a control unit configured to control a process of causing the discharge unit to discharge the imprint material while relatively moving the discharge unit and the substrate to each other, wherein the control unit is configured to change a relative movement direction of the discharge unit and the substrate in the process in accordance with the relative tilt measured by the measurement unit so as to reduce an arrangement error of the imprint material, discharged from the plurality of discharge outlets, on the substrate.

14 Claims, 10 Drawing Sheets

(56) References Cited

U.S. PATENT DOCUMENTS

2012/0075368 A1* 3/2012 Mikami ................ B41J 2/2135
                                                    347/9
2015/0091958 A1* 4/2015 Terada ...................... B41J 2/13
                                                    347/9

* cited by examiner

FORWARD MOVEMENT

MOVEMENT DIRECTION OF SUBSTRATE (FRONT → BACK)

BACKWARD MOVEMENT

MOVEMENT DIRECTION OF SUBSTRATE (BACK → FRONT)

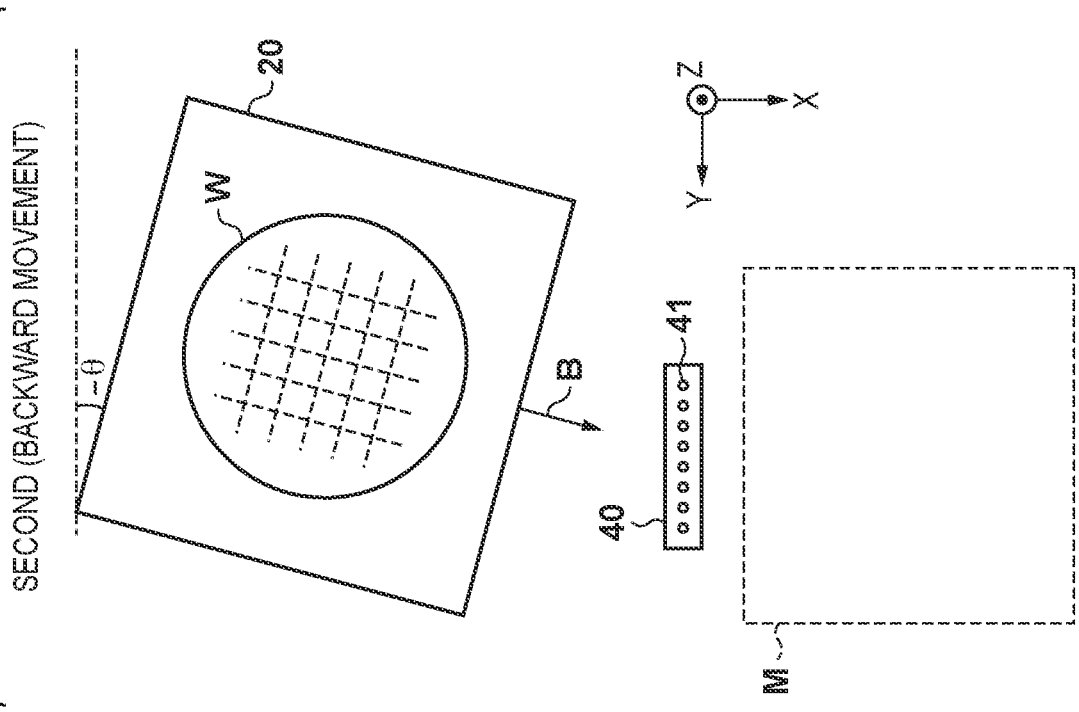
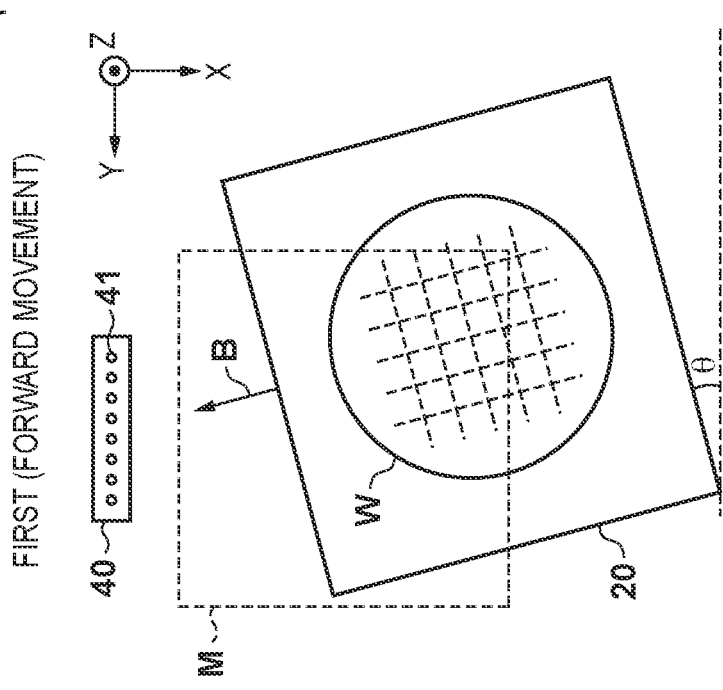
FIG. 8A  FIRST (FORWARD MOVEMENT)
FIG. 8B  SECOND (BACKWARD MOVEMENT)

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint apparatus that uses a mold to form an imprint material pattern on a substrate is gaining attention as a lithography apparatus for mass production of semiconductor devices or the like. In an imprint apparatus, an imprint material pattern can be formed on a substrate by curing an imprint material in a state in which a mold and the imprint material supplied on the substrate are in contact with each other and separating the cured imprint material from the mold. The imprint material can be supplied onto the substrate by using a discharge unit, on which a plurality of discharge outlets for discharging the imprint material are arrayed, and controlling the discharge of the imprint material from the plurality of discharge outlets while relatively moving the discharge unit to the substrate.

In the imprint apparatus, an error (a shift from a target relative tilt) can occur in the relative tilt between the discharge unit and the substrate due to, for example, aging. If there is such an error in the relative tilt of the discharge unit and the substrate, it can become difficult to accurately supply the imprint material onto the substrate because the time until the imprint material arrives at the substrate since it has been discharged will vary for each discharge outlet when the imprint material is to be supplied onto the substrate. Japanese Patent No. 5563319 proposes a method for correcting this shift in the imprint material supply position on the substrate by adjusting the discharge timing of the imprint material from each discharge outlet of the discharge outlet array.

Since many (for example, several hundred) discharge outlets are arranged on a discharge unit, it can be burdensome to individually adjust the imprint material discharge timing of each of the many discharge outlets as in the method disclosed in Japanese Patent No. 5563319.

SUMMARY OF THE INVENTION

The present invention provides, for example, a technique advantageous in accurately supplying an imprint material on a substrate by a simple method.

According to one aspect of the present invention, there is provided an imprint apparatus that forms an imprint material pattern on a substrate by using a mold, comprising: a discharge unit on which a plurality of discharge outlets configured to discharge an imprint material are arranged; a measurement unit configured to measure a relative tilt between the discharge unit and the substrate; and a control unit configured to control a process of causing the discharge unit to discharge the imprint material while relatively moving the discharge unit and the substrate to each other, wherein the control unit is configured to change a relative movement direction of the discharge unit and the substrate in the process in accordance with the relative tilt measured by the measurement unit so as to reduce an arrangement error of the imprint material, discharged from the plurality of discharge outlets, on the substrate.

Further features of the present invention will become apparent from the following description of exemplary embodiments with reference to the attached drawings.

BRIEF DESCRIPTION OF THE DRAWINGS

FIGS. 8A and 8B are views showing the direction of movement of the discharge unit and the substrate in the supplying process performed in the changed state;

DESCRIPTION OF THE EMBODIMENTS

Figure 1:
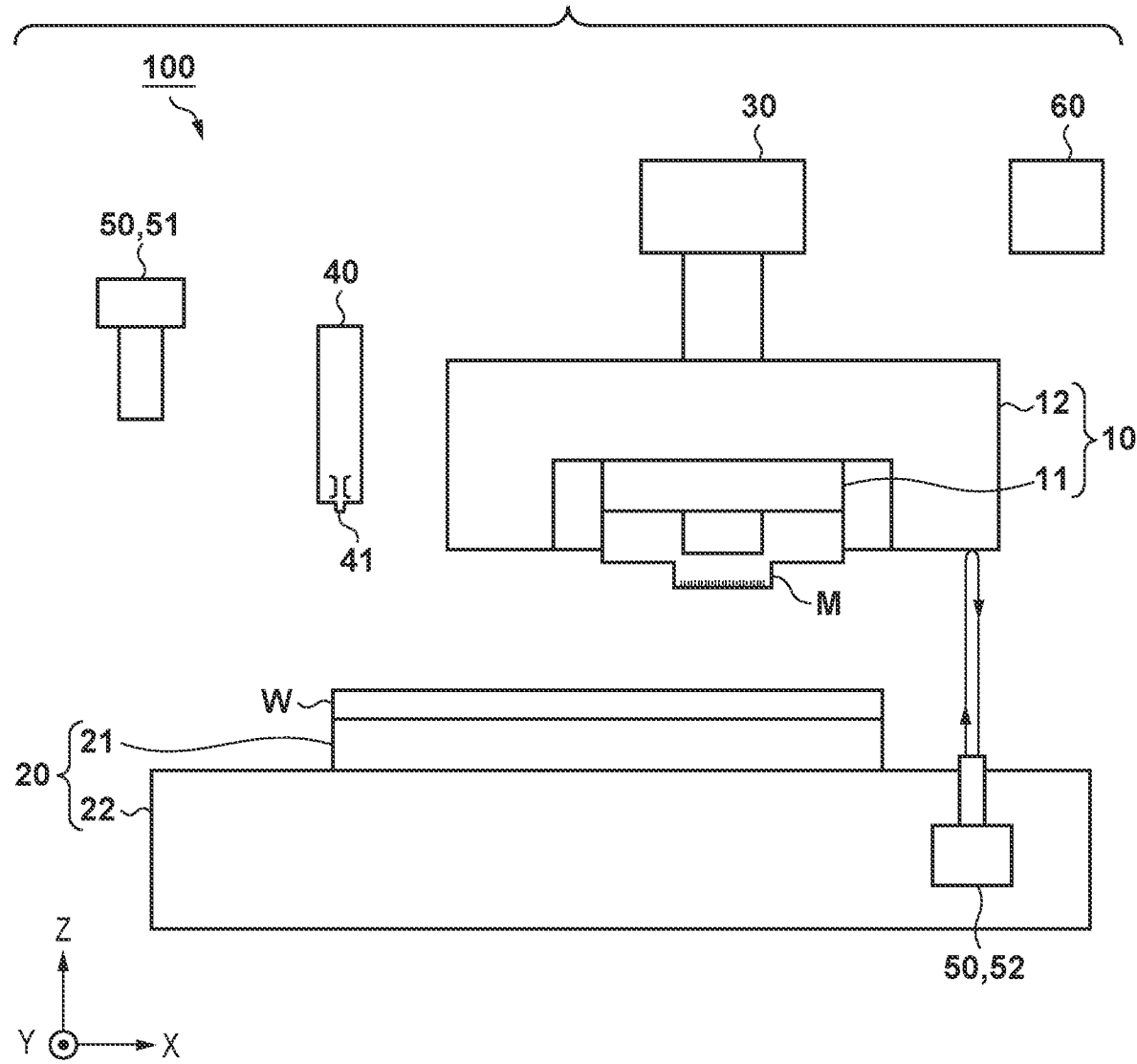
FIG. 1 is a schematic view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted. In the following embodiment, assume that the vertical direction (height direction) is a Z direction, and the two directions orthogonal to each other and perpendicular to the Z direction in a plane (in a plane that intersects with the height direction) are an X direction and a Y direction.

First Embodiment

An imprint apparatus is an apparatus that brings a mold and an imprint material supplied onto a substrate into contact and applies a curing energy to the imprint material to form a cured product pattern on which a concave/convex pattern of the mold has been transferred. For example, the imprint apparatus supplies the imprint material onto the substrate and cures the imprint material in a state in which the imprint material on the substrate is in contact with the mold which has a concave/convex pattern formation. The pattern of the mold can be transferred to the imprint material on the substrate by increasing the interval between the mold and the substrate and separating the cured imprint material from the mold. Such series of processes is called an "imprint process" and is performed on each of a plurality of shot regions on the substrate.

A curable composition (to be also referred to as an uncured resin) that is cured by application of a curing energy is used for the imprint material. An electromagnetic wave, heat, or the like is used as the curing energy. For example, light such as infrared light, visible rays, ultraviolet light, or the like whose wavelength is selected from a range of 10 nm (inclusive) to 1 mm (inclusive) is used as the electromagnetic wave.

The curable composition is a composition that is cured by light irradiation or application of heat. Of these compositions, a photo-curable composition that is cured by light contains at least a polymerizable compound and a photopolymerization initiator, and may contain a non-polymerizable compound or solvent as needed. The non-polymerizable compound is at least a material selected from the group consisting of a sensitizer, a hydrogen donor, an internal mold release agent, a surfactant, an antioxidant, a polymer component, and the like.

An imprint material is applied, on a substrate, in a film-like manner by a spin coater or a slit coater. Alternatively, the imprint material may be supplied in a droplet form, an island form with droplets being chained together, or a film form onto a substrate. The viscosity (at 25° C.) of the imprint material is 1 mPa·s (inclusive) to 100 mPa·s (inclusive).

[Arrangement of Imprint Apparatus]

An imprint apparatus 100 according to the first embodiment of the present invention will be described next. FIG. 1 is a schematic view showing the arrangement of the imprint apparatus 100 according to the first embodiment. The imprint apparatus can include, for example, an imprint head 10 that holds a mold, a substrate stage 20 that can move while holding a substrate, a curing unit 30, a discharge unit 40 (dispenser), measurement units 50, and a control unit 60. The control unit 60 is formed by, for example, a computer that includes a CPU, and controls the imprint process by controlling each unit of the imprint apparatus 100.

Normally, a mold M is made of a material such as quartz that can transmit ultraviolet light. A concave/convex pattern that is to be transferred to an imprint material on a substrate is formed on a partial region (pattern region) protruding toward the substrate side on the substrate-side surface of the mold. Also, glass, a ceramic, a metal, a semiconductor, or a resin can be used as a substrate W, and a member formed from a material different from the substrate W may be formed on its surface, as needed. More specifically, the substrate W is, for example, a silicon wafer, a compound semiconductor wafer, or a silica glass wafer. In addition, an adhesion layer can be arranged between the imprint material and the substrate to increase adhesion, as needed, before the imprint material is applied.

The imprint head 10 can include, for example, a mold chuck 11 that can hold the mold M by a vacuum force or the like, and a mold driving unit 12 configured to drive the mold M (the mold chuck 11) in the Z direction so as to change the interval between the mold M and the substrate W. In this embodiment, the imprint head 10 can drive the mold M in the Z direction to perform a contact process of bringing the mold M and the imprint material on the substrate into contact with each other and a mold separation process of separating the mold from the cured imprint material. In addition, the imprint head 10 according to this embodiment may not only have a function to drive the mold M in the Z direction, but also have a function to drive the mold M in the X and Y directions and a θ direction (a rotation direction about the Z-axis) and a function to change the tilt of the mold M. For example, according to the latter function, it is possible to control the tilt of the mold M so that the pattern region of the mold M will be parallel to the substrate W in the contact process of the mold M and the imprint material on the substrate.

The substrate stage 20 can include, for example, a substrate chuck 21 that holds the substrate W by a vacuum force and a substrate driving unit 22 that drives the substrate W in the X and Y directions. In this embodiment, the substrate stage 20 can drive the substrate in the X and Y directions to position the substrate W with respect to the mold M and to position the substrate W with respect to the supply unit. In addition, the substrate stage 20 may not only have a function to drive the substrate W in the X and Y directions, but also have a function to drive the substrate W in the Z direction and the θ direction and a function to change the tilt of the substrate W.

The curing unit 30 (irradiation unit) cures the imprint material by irradiating the imprint material on the substrate with light (for example, ultraviolet light) via the mold M in a state in which the mold M and the imprint material on the substrate are in contact with each other.

Figure 2:
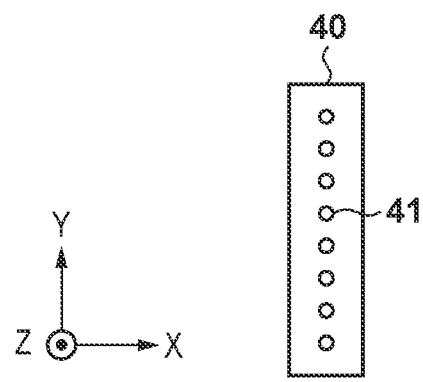
FIG. 2 is a view showing a discharge unit when seen from below.

As shown in FIG. 2, the discharge unit 40 includes a discharge outlet array on which a plurality of discharge outlets 41 are arranged along the Y direction, and discharges the imprint material from the plurality of discharge outlets 41 to the substrate W. FIG. 2 is a view showing the discharge unit 40 when viewed from below (-Z direction). Each discharge outlet 41 includes a piezoelectric device as a discharge mechanism, and can discharge imprint material droplets by using a piezoelectric effect to push out the imprint material. The control unit 60 can control the waveform (to be referred to as the driving waveform hereinafter) of a voltage applied to the piezoelectric device and the voltage application timing according to this driving waveform. Although the discharge unit 40 that includes one discharge outlet array will be described in this embodiment, the number of discharge arrays is not limited to one and a plurality of discharge arrays may be included.

The imprint apparatus 100 according to this embodiment can supply the imprint material to the substrate by discharging imprint material droplets from each of the plurality of discharge outlets 41 of the discharge unit 40 while moving the discharge unit 40 and the substrate W relatively to each other. The imprint material supplying process performed on the substrate is controlled based on, for example, a target position of an imprint material on the substrate, that is, information (also referred to as an arrangement pattern) indicating the target position on the substrate where the imprint material droplet is to be supplied. This kind of information can be generated in advance so that the residual layer thickness of the imprint material pattern formed by the mold M will be a target layer thickness based on the dimension information of the concave/convex pattern of the mold M, the amount of imprint material discharged as droplets from each discharge outlet 41, and the like. The residual layer thickness (RLT) of the imprint material is the thickness of the imprint material between the substrate W and the bottom side of the concave portion of the concave/convex pattern formed by the imprint material.

In this case, the imprint material supplying process performed on the substrate is performed a plurality of times by changing the movement direction of the substrate W with respect to the discharge unit 40 so that a greater number of imprint material droplets can be supplied to the substrate and the density of the imprint material droplets on the substrate can be increased. For example, in the first supplying process (first process, forward movement), the imprint material is discharged from each of the plurality of discharge outlets 41 while the substrate W is moved, with respect to the discharge unit 40, in a direction (for example, the −X direction) away from the mold M. After the first supplying process ends, the substrate W is moved in the Y direction (in the +Y direction or −Y direction) by a distance smaller than the interval (pitch) of the plurality of discharge outlets 41. Next, in the second supplying process (second process, backward movement), the imprint material is discharged from each of the plurality of discharge outlets 41 while the substrate W is moved, with respect to the discharge unit 40, in a direction (for example, the +X direction) to approach the mold M. The density of the imprint material droplets supplied onto the substrate can be increased by performing the supplying process a plurality of times in this manner.

The measurement units 50 measure the relative tilt between the discharge unit 40 and the substrate W. For example, the measurement units 50 can measure, as the relative tilt between the discharge unit 40 and the substrate W, the relative orientation of a surface (to be referred as a substrate surface hereinafter) of the substrate W and a reference surface of the discharge unit 40 which can uniquely define the discharge direction of the imprint material from the discharge unit 40. The reference surface may be the lower surface (to be also referred to as a discharge surface hereinafter) of the discharge unit 40 on which the plurality of discharge outlets 41 are arranged. However, the present invention is not limited to this, and the reference surface may be the upper surface or the side surface of the discharge unit 40 as long as the discharge direction of the imprint material can be uniquely defined.

The measurement units 50 according to this embodiment include a first measurement unit 51 that measures the height distribution of the substrate surface and a second measurement unit 52 that measures the height distribution of the reference surface (lower surface) of the discharge unit 40, and the relative tilt between the discharge unit 40 and the substrate W is measured based on the measurement results of these measurement units. More specifically, the first measurement unit 51 includes, for example, a spectral interference laser displacement meter, and measures the height distribution of the substrate surface by obtaining the height (the position in the Z direction) of each of the plurality of positions on the substrate W by irradiating each of the plurality of positions with a laser beam while moving the substrate W by the substrate stage 20. Also, the second measurement unit 52 includes, for example, a spectral interference laser displacement meter, and is provided in the substrate stage 20. The second measurement unit 52 measures the height distribution of the discharge surface by obtaining the height (the position in the Z direction) of each of the plurality of positions on the discharge surface by irradiating each of the plurality of positions with a laser beam while moving by the substrate stage 20. As a result, the measurement units 50 can measure the relative tilt of the discharge unit 40 and the substrate W based on the height distribution of the substrate surface measured by the first measurement unit 51 and the height distribution of the discharge surface measured by the second measurement unit 52.

[Imprint Material Arrangement Error Difference]

An error (a shift from the target relative tilt) can occur in the relative tilt between the discharge unit 40 and the substrate W in the imprint apparatus 100 due to, for example, aging. If such a relative tilt error occurs, the time (flight duration) from the discharge of the imprint material until the arrival of the imprint material on the substrate will differ for each discharge outlet 41 when the supplying process for supplying the imprint material onto the substrate is performed. As a result, it can become difficult to accurately supply the imprint material onto the substrate.

Figure 3A:
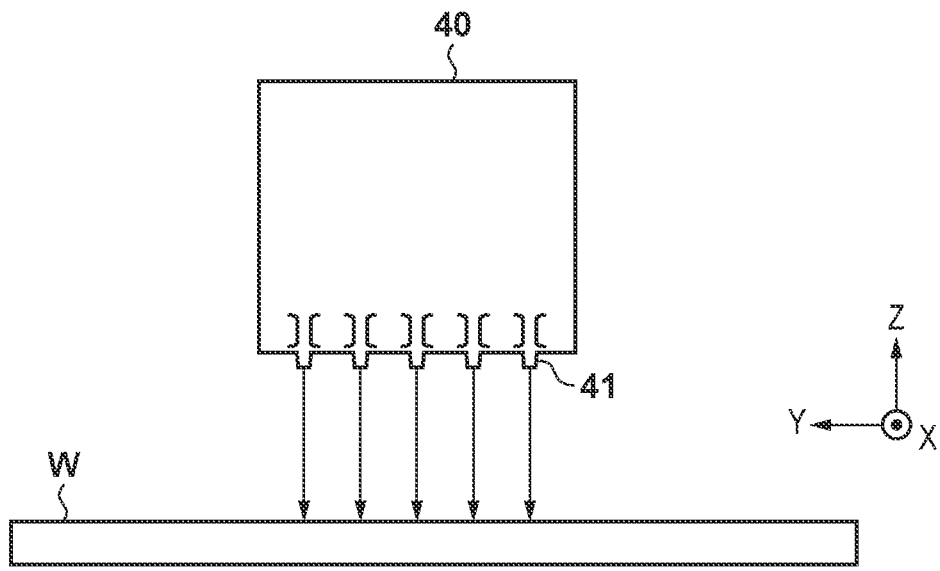
FIGS. 3A to 3B are views showing an example of an imprint material supplying process in an ideal state.
Figure 3B:
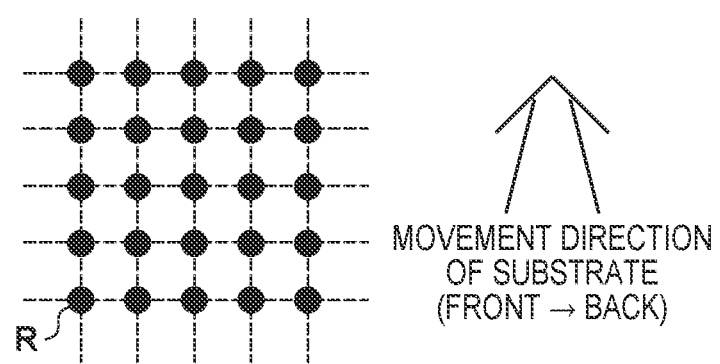

FIGS. 3A and 3B are views showing an example of the imprint material supplying process performed in a state in which there is no error in the relative tilt between the discharge unit 40 and the substrate W, that is, a state (to be referred to as an ideal state hereinafter) in which the discharge unit 40 and the substrate W are arranged at a target relative tilt. The target relative tilt is, for example, the relative tilt between the discharge unit 40 and the substrate W when the discharge direction of the imprint material from each discharge outlet 41 and the substrate surface form a target get angle (for example, 90° (perpendicular)). FIG. 3A is a view showing the relative tilt between the discharge unit 40 and the substrate W in the ideal state, and FIG. 3B is a view showing the arrangement of the imprint material (droplets) supplied on the substrate when the discharge unit 40 and the substrate W are moved relatively in the reference direction during a supplying process in the ideal state. In this ideal state, as shown in FIG. 3A, since the distance between the discharge outlet 41 and the substrate W will be the same for each of the plurality of discharge outlets 41, the flight duration of the imprint material discharged from each discharge outlet 41 will be the same for each of the plurality of discharge outlets 41. Hence, in the ideal state, the relative movement directions of the discharge unit 40 and the substrate W during the supplying process are set to the reference directions (±X directions) perpendicular to the arrangement directions (±Y directions) of the plurality of discharge outlets 41. As a result, as shown in FIG. 3B, an imprint material R (droplets) can be arranged on the substrate in accordance with the imprint material target supply positions (the intersections of broken lines defined on the substrate) defined on the substrate.

Figure 4A:
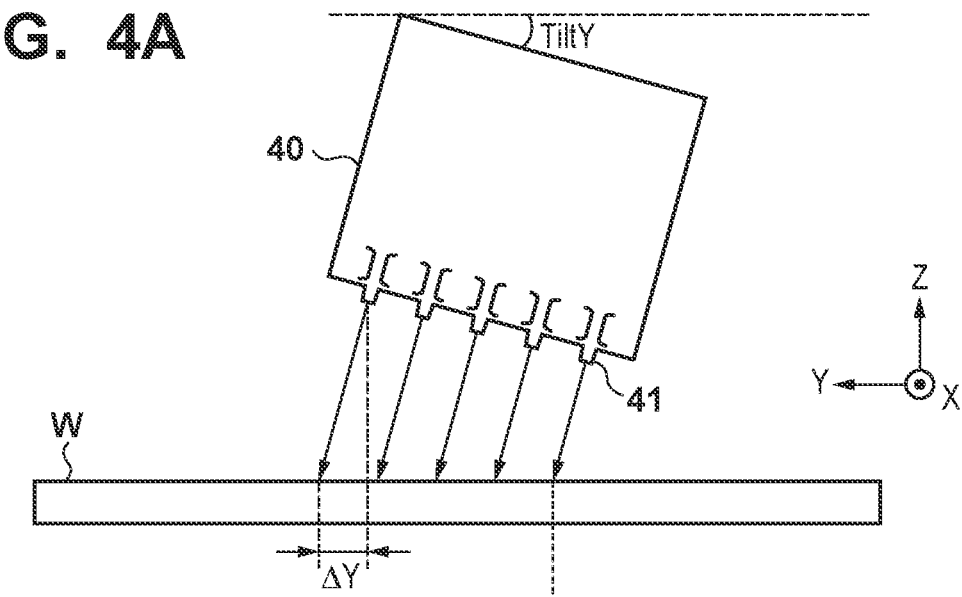
FIGS. 4A to 4C are views showing an example of the imprint material supplying process in a changed state.
Figure 4B:
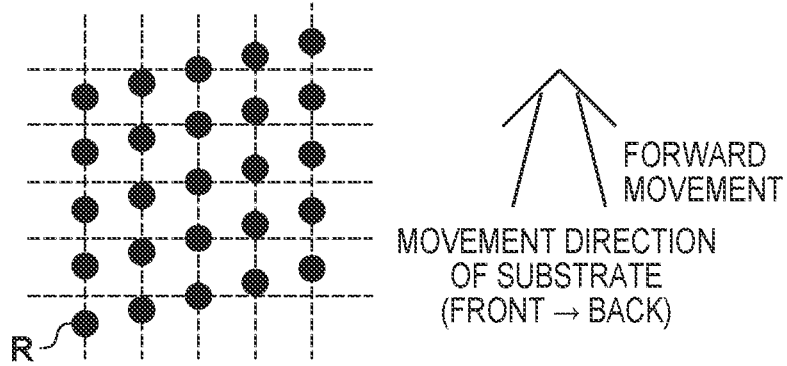
Figure 4C:
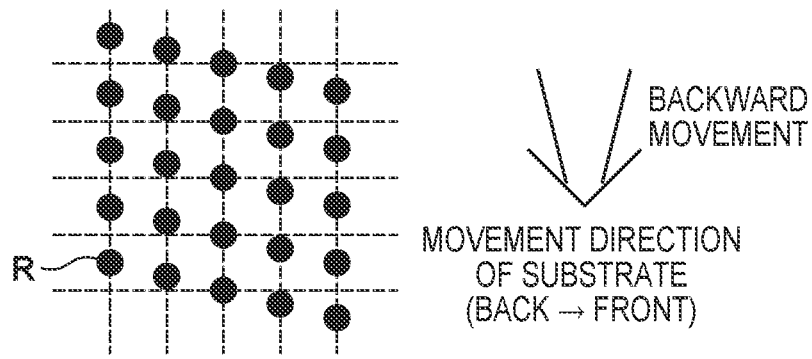

On the other hand, FIGS. 4A to 4C are views showing an example of the imprint material supplying process performed in a state in which there is an error in the relative tilt between the discharge unit 40 and the substrate W, that is, a state (to be referred to as a changed state hereinafter) in which the discharge unit 40 and the substrate W have changed from the target relative tilt. For example, FIG. 4A is a view showing the relative tilt between the discharge unit 40 and the substrate W in the changed state. Also, FIGS. 4B and 4C are views showing the arrangement of the imprint material (droplets) supplied onto the substrate when the discharge unit 40 and the substrate W are moved relatively in each reference direction during the supplying process performed in the changed state. FIG. 4B shows the arrangement of the imprint material supplied to the substrate when the substrate W is moved in the −X direction (a direction from the front to the back of the drawing) in the state shown in FIG. 4A. In addition, FIG. 4C shows the arrangement of the imprint material supplied to the substrate when the substrate W is moved in the +X direction (a direction from the back to the front of the drawing) in the state shown in FIG. 4A.

In this changed state, as shown in FIG. 4A, since the distance between the discharge outlet 41 and the substrate W will vary for each discharge outlet 41, the flight duration of the imprint material discharged from the discharge outlet 41 can vary for each discharge outlet 41. That is, since the discharge outlet 41 whose distance to the substrate W is smaller than the design value will have an imprint material flight duration that is shorter than the design time, the imprint material will be supplied to the front of the corresponding target supply position in the movement direction of the substrate W. In addition, since the discharge outlet 41 whose distance to the substrate W is larger than the design value will have an imprint material flight duration that is longer than the design time, the imprint material will be supplied to the back of the corresponding target supply position in the movement direction of the substrate W.

Figure 5A:
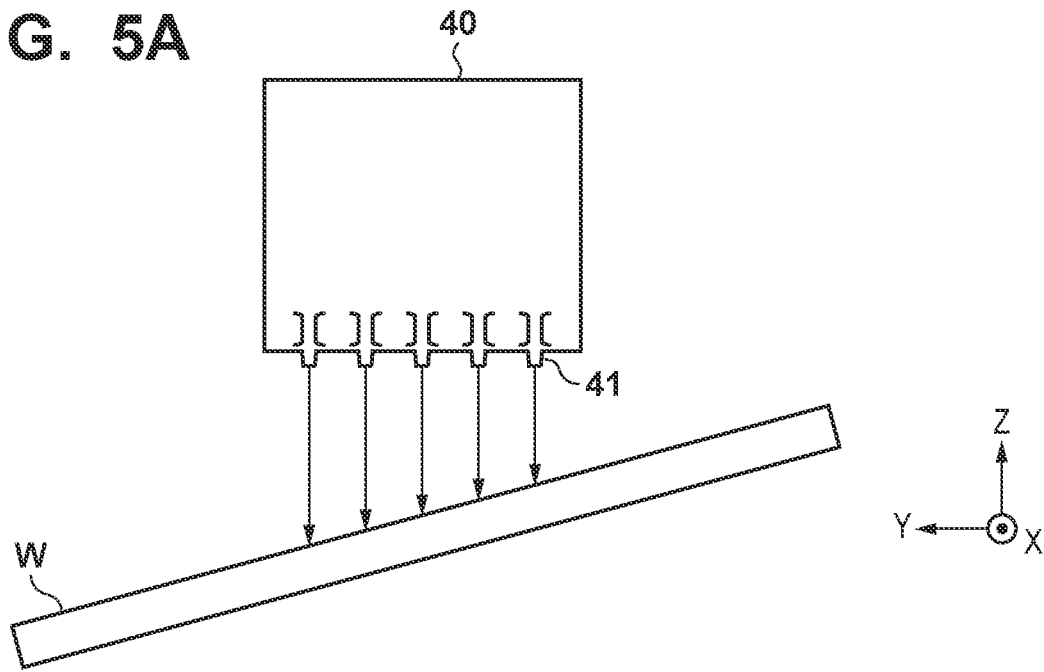
FIGS. 5A to 5C are views showing an example of the imprint material supplying process in a state in which the surface of a substrate is tilted with respect to the discharge unit.
Figure 5B:
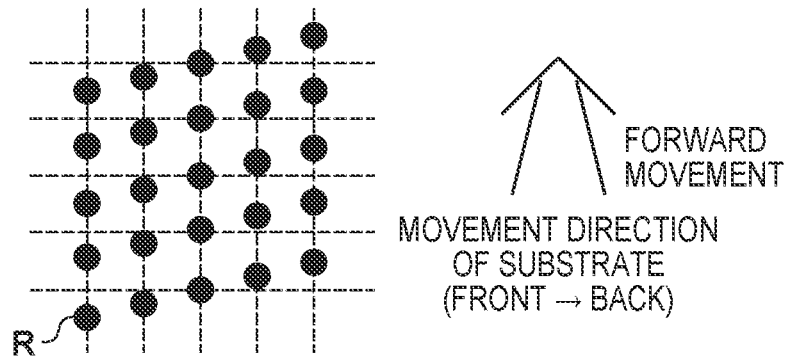
Figure 5C:
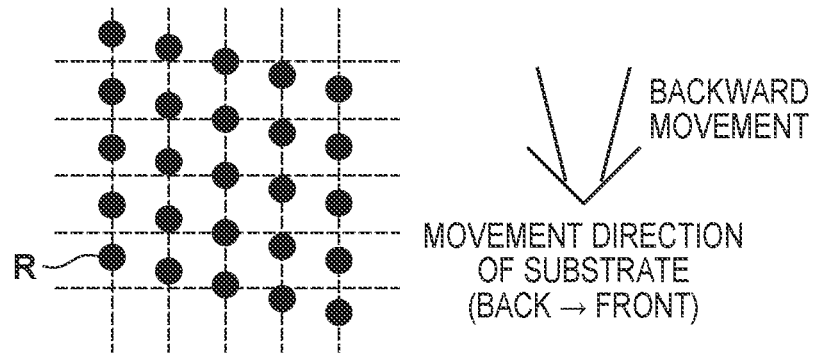

That is, in the changed state, if the relative movement directions between the discharge unit 40 and the substrate W during the supplying process are set to the reference directions (±X directions), the arrangement directions of the imprint material droplets R discharged from the plurality of discharge outlets 41 onto the substrate will form a parallelogram shape as shown in FIGS. 4B and 4C. Hence, it can become difficult to arrange the imprint material R (droplets) on the substrate in accordance with the target supply positions (the points of intersection of broken lines defined on the substrate). The change in the arrangement directions of the imprint material on the substrate in this manner is not limited to a case in which the discharge unit 40 (the discharge surface) is tilted with respect to the substrate surface as shown in FIGS. 4A to 4C. It may also similarly occur in a case in which the substrate surface is tilted with respect to the discharge unit 40 (the discharge surface) as shown in FIGS. 5A to 5C.

Thus, in the imprint apparatus 100 according to this embodiment, the relative movement directions of the substrate W and the discharge unit 40 during the supplying process is changed in accordance with the relative tilt measured by the measurement units 50 so as to reduce the arrangement error of the imprint material discharged from the plurality of discharge outlets 41 onto the substrate. That is, as described above, if the discharge unit 40 and the substrate W are tilted relatively to each other, a flight duration difference is generated between the imprint material droplets discharged from the plurality of discharge outlets 41, and this flight duration difference can cause an error in the arrangement of the imprint material droplets on the substrate which are discharged from the plurality of discharge outlets 41. In this embodiment, such an arrangement error of the imprint material on the substrate will be compensated by changing the directions of movement (movement directions) in which the discharge unit 40 and the substrate W are relatively moved during the supplying process. An imprint process according to this embodiment will be described hereinafter. An example in which the substrate W is moved with respect to the discharge unit 40 will be described in the following description. However, the present invention is not limited to this, and can be applied in the same manner to a case in which the discharge unit 40 and the substrate W are moved relatively with respect to each other.

[Imprint Process]

Figure 6:
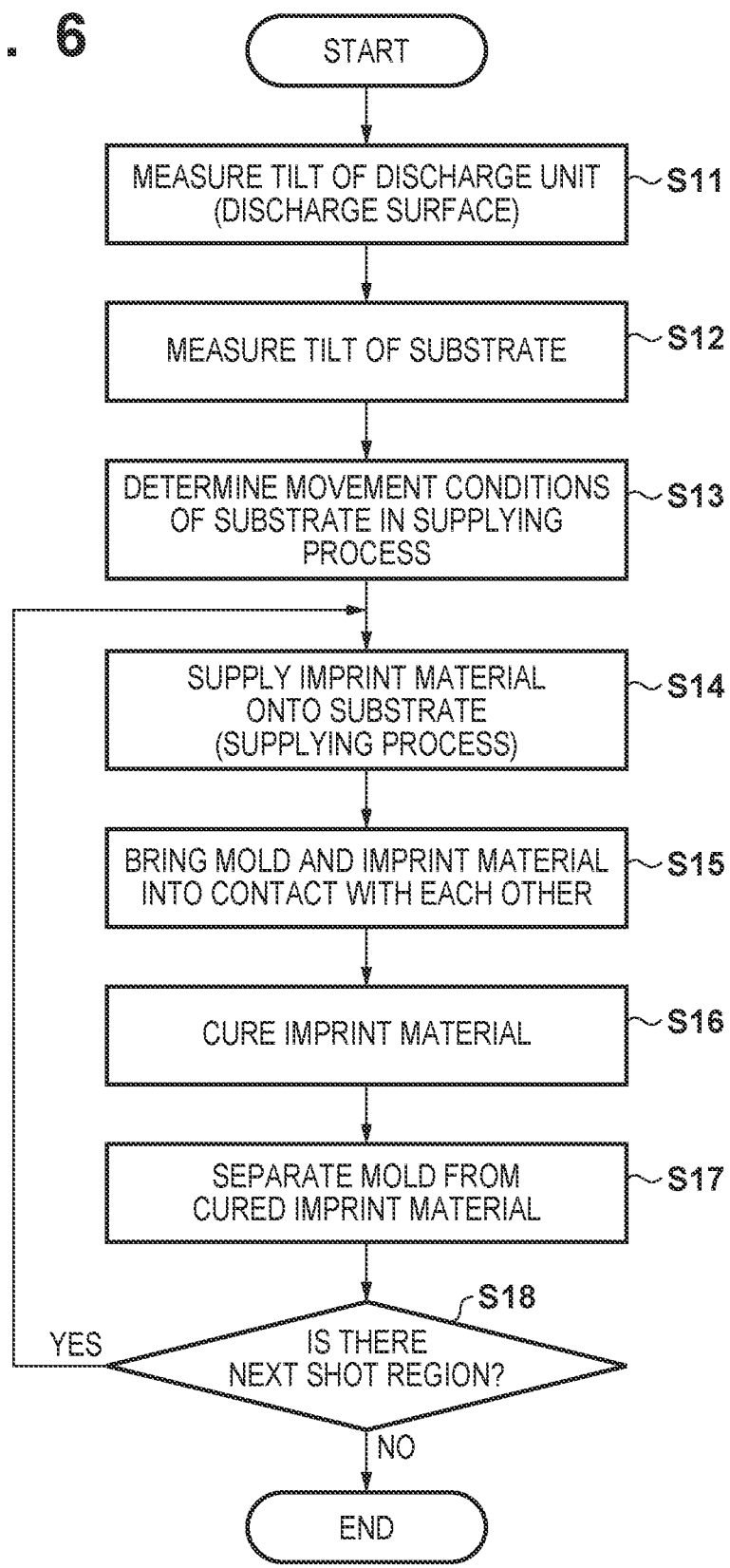
FIG. 6 is a flowchart showing an imprint process.

The imprint process according to this embodiment will be described with reference to FIG. 6. FIG. 6 is a flowchart showing an imprint process according to this embodiment. Each process of the flowchart shown in FIG. 6 can be performed by the control unit 60.

In step S11, the control unit 60 moves the substrate stage 20 so that the second measurement unit 52 will be arranged below the discharge unit 40, and causes the second measurement unit 52 to measure the height distribution of the discharge surface to obtain the tilt of the discharge surface. Although the tilt of the discharge surface is measured in each imprint process in this embodiment, the present invention is not limited to this. For example, the tilt of the discharge surface may be performed based on a predetermined time interval such as once a day, once every few hours, once each time N substrates have been processed, or the like. In addition, in step S12, the control unit 60 moves the substrate stage 20 so that the substrate W will be arranged below the first measurement unit 51, and causes the first measurement unit 51 to measure the height of the substrate surface to obtain the tilt of the substrate W. The control unit 60 can obtain the relative tilt between the discharge unit 40 and the substrate W by performing the processes of steps S11 and S12.

In step S13, based on the relative tilt between the discharge unit 40 and the substrate W obtained in steps S11 and S12, the movement conditions of the discharge unit 40 and the substrate W when the imprint material is to be supplied to the target shot region of the substrate W are determined. For example, the relative movement directions of the discharge unit 40 and the substrate W during the supplying process and the position in the rotation direction (the θ direction) of the substrate W during the supplying process can be set as the movement conditions. Note that the determination of the movement conditions will be described later. In step S14, the control unit 60 supplies (supplying process) the imprint material onto the target shot region of the substrate W by causing the discharge unit 40 to discharge the imprint material while moving the discharge unit 40 and the substrate W relatively to each other based on the movement conditions determined in step S13.

In step S15, the control unit 60 moves the substrate W so that the target shot region will be arranged below the mold M (the pattern region). Subsequently, the control unit controls the imprint head 10 to reduce the interval between the mold M and the substrate W, and brings the mold M and the imprint material on the substrate into contact with each other. In step S16, when the concave portion of the mold M has been sufficiently filled with the imprint material, the control unit 60 controls the curing unit 30 to irradiate the imprint material with light to cure the imprint material. In step S17, the control unit 60 controls the imprint head 10 to increase the interval between the mold M and the substrate W to separate the mold M from the cured imprint material. In step S18, the control unit 60 determines whether there is a shot region (the next shot region) that is to undergo the imprint process next on the substrate. If the next shot region is present, the process advances to step S14. Otherwise, the process ends.

An additional description will be given here about the movement of the substrate W in the process of step S15. When a target shot region which has already been supplied with imprint material is to be arranged below the mold M (the pattern region), the substrate W is moved (positioned) so that the position in the rotation direction (the θ direction) of the pattern region of the mold M and that of the target shot region (the imprint material supply region) will match. Each of the pattern region of the mold M and the target shot region can be, for example, a rectangular region. Although a mode in which the substrate stage 20 is used to adjust the rotation position of the substrate W is assumed as the mode of this positioning in the rotation direction, the positioning may be performed by using the imprint head 10 to rotate and adjust the mold M.

If the present invention is applied, the arrangement of the imprint material supplied to the substrate W will be corrected from a parallelogram shape to a rectangular shape. In a case in which the position in the rotation direction (the θ direction) of the substrate W is not used as one of the movement conditions set in step S13, the imprint material is supplied to the substrate in a state in which the rotation position of the arrangement of the supplied imprint material has been rotated by an amount not rotated during the supplying process with respect to the actual assumed rotation position of the substrate W. Hence, in this case, in step S15, the substrate stage 20 can rotate the substrate W in a direction that cancels the rotation amount of the arrangement of the supplied imprint material on the substrate to make the rotation position of the pattern region of the mold M and the rotation position of the imprint material arrangement match. This case is effective for, for example, a first layer substrate that does not have an underlayer which serves as a supply target position on the substrate. Alternatively, in the case of a second layer substrate that has an underlayer, if the substrate is loaded onto the substrate stage by rotating the substrate in advance by an amount in which the substrate is to be rotated and supplied at the time of the imprint material supplying process when the substrate is to be loaded, the rotation position need not be included in the movement conditions of step S13.

[Movement Condition Determination Method]

Figure 7:
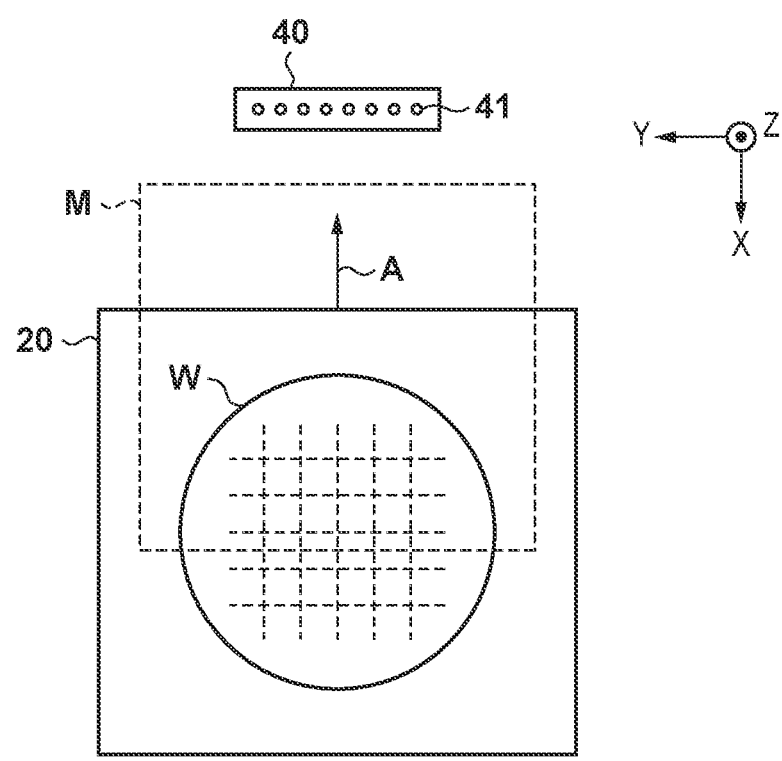
FIG. 7 is a view showing a direction of movement of the discharge unit and the substrate in the supplying process performed in the ideal state.

The determination method of movement conditions in step S13 will be described next with reference to FIGS. 7, 8A, and 8B. FIG. 7 is a view showing the movement direction of the discharge unit 40 and the substrate W during the supplying process performed in the ideal state. In addition, FIGS. 8A and 8B are views showing the movement direction of the discharge unit 40 and the substrate W during the supplying process performed in a state (changed state) in which there is an error in the relative tilt between the discharge unit 40 and the substrate W. FIG. 8A shows the first supplying process, and FIG. 8B shows the second supplying process. FIGS. 7, 8A, and 8B are views in which the positional relationship between the substrate W (the substrate stage 20) and the discharge unit 40 is seen from above (+Z direction) in the supplying process, and the position of the mold M is indicated by broken lines.

As described above, in the ideal state (FIG. 7), the imprint material droplets discharged from the plurality of discharge outlets 41 have the same flight duration. Hence, the control unit 60 determines that a reference direction (−X direction) perpendicular to the arrangement directions (±Y directions) of the plurality of the discharge outlets 41 will be the movement direction (an arrow A) of the substrate during the supplying process. By performing the supplying process while moving the discharge unit 40 and the substrate W relatively in accordance with the movement direction determined in this manner, the imprint material (droplets) can be arranged on the substrate in accordance with the imprint material target supply positions (the intersections of the broken lines defined on the substrate).

On the other hand, in the changed state (FIGS. 8A and 8B), the imprint material droplets discharged from the plurality of discharge outlets 41 have different flight durations from each other. Hence, the control unit 60 will determine, based on the relative tilt of the discharge unit 40 and the substrate W measured by the measurement units 50, the movement direction (an arrow B) of the substrate during the supplying process so that the arrangement error of the imprint material, which is discharged from the plurality of discharge outlets 41, on the substrate will be reduced. For example, the control unit 60 estimates, based on the relative tilt measured by the measurement units 50, the arrangement of the imprint material on the substrate when the imprint material droplets are discharged from the plurality of discharge outlets 41 while the substrate W is moved in the reference direction. The movement direction of the substrate during the supplying process is determined so as to reduce the arrangement error which is defined by the difference between the estimated imprint material arrangement (estimated arrangement) and the target arrangement of the imprint material on the substrate. More specifically, the control unit 60 obtains an angle difference θ between the estimated arrangement direction and the target arrangement direction and determines that a direction obtained by rotating the substrate by the angle difference θ with respect to reference direction (X direction) is to be the movement direction (arrow B) of the substrate during the supplying process.

The control unit 60 can determine the movement direction of the substrate W for each of the first supplying process (FIG. 8A) and the second supplying process (FIG. 8B). A value obtained by inverting the sign of the angle difference θ with respect to the first supplying process is used in the second supplying process. More specifically, in a case in which a direction obtained by rotating the substrate by the angle difference θ with respect to the reference direction is determined to be the movement direction of the substrate W in the first supplying process, the control unit 60 will determine a direction obtained by rotating the substrate by the angle difference −θ with respect to the reference direction to be the movement direction of the substrate W in the second supplying process.

Additionally, as described above, in a case in which the direction obtained by rotating the substrate by the angle difference θ with respect to the reference direction is determined to be the movement direction, it is preferable to also adjust (change) the position in the rotation direction (the θ direction) of the substrate in accordance with the determined movement direction. For example, as shown in FIGS. 8A and 8B, the control unit 60 will adjust the position in the rotation direction of the substrate W based on information (the intersections of the broken lines defined on the substrate) indicating the imprint material target supply positions defined on the substrate by a lattice grid. That is, the control unit 60 determines, based on the information, the position in the rotation direction of the substrate W so that the imprint material droplets will be supplied to the target supply positions when the substrate W is moved in the changed movement direction. In this embodiment, the control unit 60 determines, as the position of the substrate W in the rotation direction in the changed state, a position obtained by changing the substrate W by the angle difference θ in the rotation direction with respect to the ideal state.

Figure 9A:
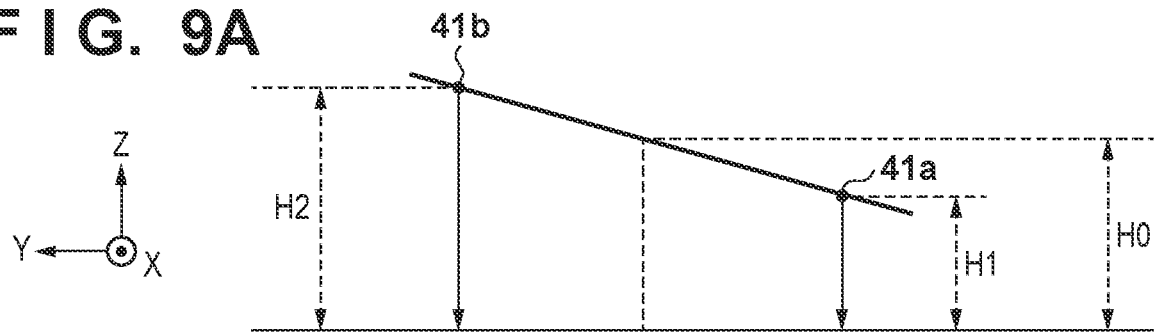
FIGS. 9A and 9B are views for explaining a method for calculating an angle difference θ.
Figure 9B:
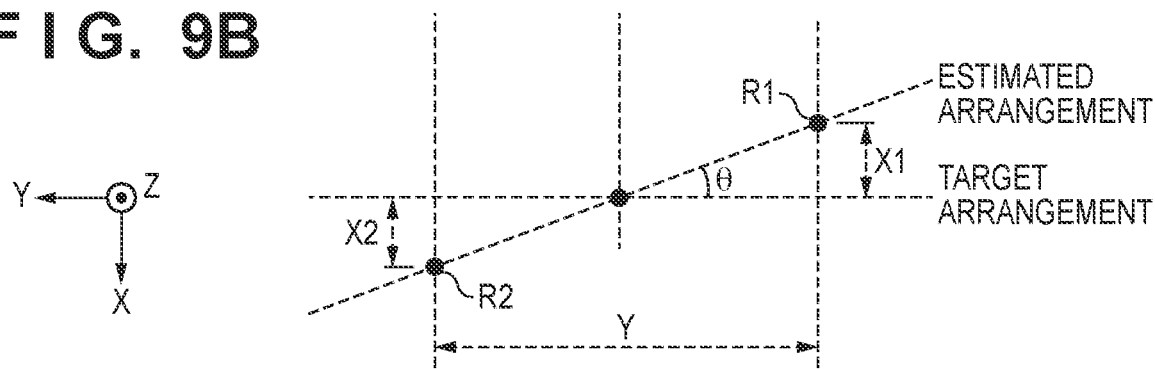

The calculation method of the angle difference θ will be described next with reference to FIGS. 9A and 9B. FIGS. 9A and 9B are views for explaining the calculation method of the angle difference θ. FIG. 9A shows a schematic view obtained when the discharge unit 40 is seen from the +X direction, and FIG. 9B is a schematic view obtained when the substrate W is seen from the +Z direction. The control unit 60 can calculate the angle difference θ by using at least two discharge outlets 41 of the plurality of the discharge outlets 41 included in the discharge outlet array of the discharge unit 40. The two discharge outlets 41 used in the calculation of the angle difference θ are preferably spaced apart from each other in the Y direction as much as possible. For example, it is preferable to select the discharge outlets 41 positioned at both ends of the discharge outlet array.

As shown in FIG. 9A, in the case of a discharge outlet 41a whose distance value (a distance H1) between the discharge outlet 41 and the substrate W is smaller than a design value H0, the supply position of an imprint material R1 on the substrate will shift to the front of the target arrangement (target supply position) in the movement direction of the substrate W by X1. Also, in the case of a discharge outlet 41b whose distance value (a distance H2) between the discharge outlet 41 and the substrate W is larger than a design value H0, the supply position of an imprint material R2 on the substrate will shift to the back of the target arrangement (target supply position) in the movement direction of the substrate W by X2. These supply position shift amounts X1 and X2 can be obtained by $$X1=(H0/Vd-H1/Vd) \times Vs \quad (1)$$

$$X2=(H0/Vd-H2/Vd) \times Vs \quad (2)$$

Hence, as shown in FIG. 9B, the angle difference θ between the estimated arrangement and the target arrangement of the imprint material can be obtained based on the shift amounts X1 and X2 by $$\theta = \arctan((|X1|+|X2|)/Y) \quad (3)$$

In equations (1) to (3), "Vd" represents the discharge velocity of the imprint material from each discharge outlet 41, "Vs" represents the movement velocity of the substrate W used in the supplying process, and "Y" represents the Y-direction interval between the discharge outlet 41a which has the distance H1 and the discharge outlet 41b which has the distance H2. Note that the relative movement velocity of the discharge unit 40 and the substrate W can be used as "Vs" instead of the movement velocity of the substrate W.

As described above, the imprint apparatus 100 according to this embodiment changes the movement direction of the substrate W during the supplying process in accordance with the relative tilt between the discharge unit 40 and the substrate W measured by the measurement units 50. As a result, it is possible to reduce the imprint material arrangement error on the substrate that occurs due to the relative tilt between the discharge unit 40 and the substrate W, and to supply the imprint material accurately onto the substrate.

In this embodiment, there is a concern that the arrangement pitch of the imprint material (droplets) supplied on the substrate will shift with respect to the design value due to the relative tilt between the discharge unit 40 and the substrate W and the change in the movement direction of the substrate W during the supplying process. However, in practice, since the increase in the arrangement pitch due to the tilting of the discharge unit 40 and the substrate W will be compensated (canceled) by the decrease in the arrangement pitch due to the change in the movement direction of the substrate, the shift in the arrangement pitch with respect to the design value will hardly occur. This effect will be described below by using more specific numerical values.

For example, in the example shown in FIGS. 9A and 9B, let a tilt Y of the discharge surface be 1000 μrad, a Y-direction interval Y between the two discharge outlets 41a and 41b which are spaced apart from each other the most be 40 mm, and the design value H0 of the distance between each discharge outlet 41 and the substrate W be 300 μm. In this case, the distance H1 between the discharge outlet 41a and the substrate W is 280 μm, and the distance H2 between the discharge outlet 41b and the substrate W is 320 μm. Also, letting the discharge velocity Vd of the imprint material be 3,000 mm/sec and the movement velocity Vs of the substrate W be 1,000 mm/sec, the shift amounts X1 and X2 and the angle difference θ can be calculated in the following manner.

$$X1=(300 \text{ μm}-280 \text{ μm})\div 300 \text{ mm/s}\times 1000 \text{ mm/s}=6.667 \text{ μm}$$

$$X2=(300 \text{ μm}-320 \text{ μm})\div 300 \text{ mm/s}\times 1000 \text{ mm/s}=-6.667 \text{ μm}$$

$$\theta = \arctan((|6.667 \text{ μm}|+|-6.667 \text{ μm}|)\div 40 \text{ mm})=333.333 \text{ μrad}$$

That is, each of the imprint material supply position shift amounts X1 and X2 is about 7 μm, and the angle difference θ for correcting these supply position shift amounts is about 300 μrad.

Figure 10:
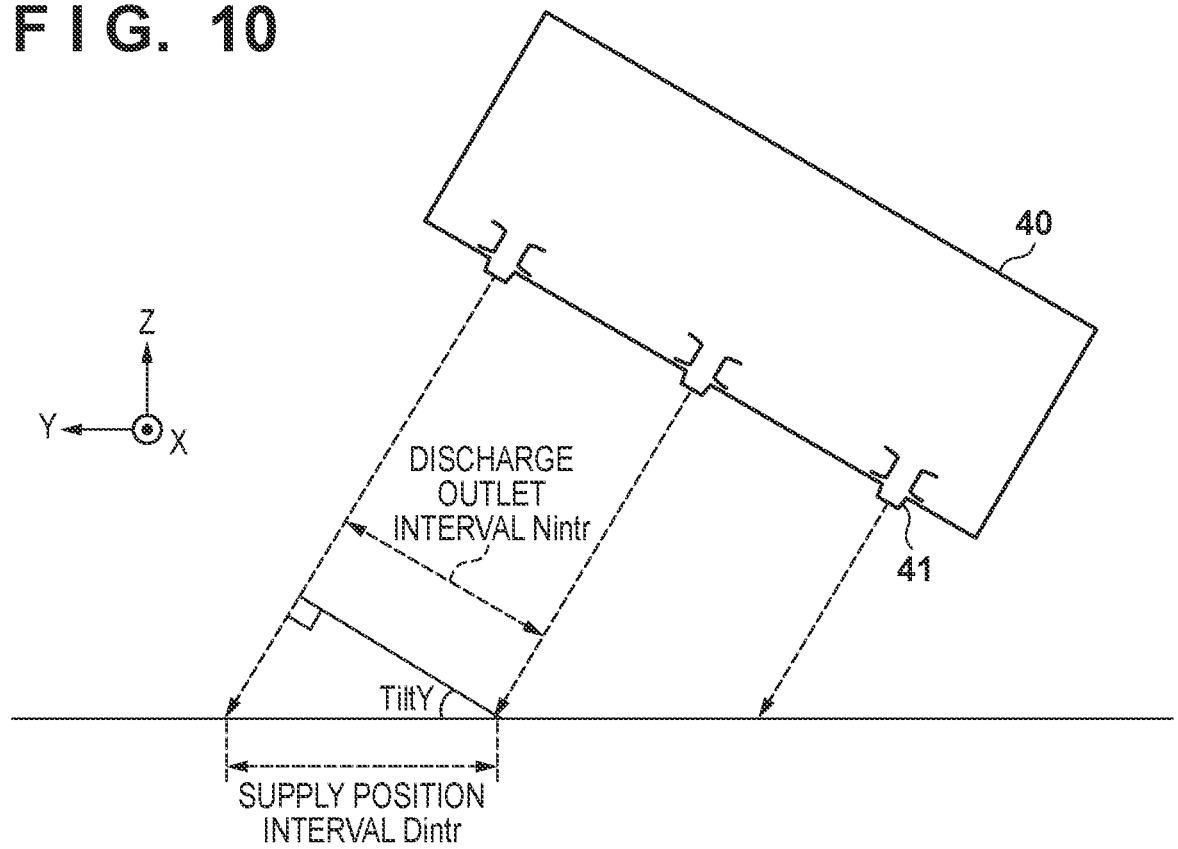
FIG. 10 is a view for explaining the relationship between a discharge outlet interval and a supply position interval of the imprint material on the substrate.

The relationship of the interval (to be referred to as a discharge outlet interval hereinafter) of the plurality of discharge outlets 41 provided in the discharge unit 40 and the interval (to be referred to as a supply position interval hereinafter) between the supply positions of the imprint material (droplets) on the substrate will be described next with reference to FIGS. 10 and 11. In the ideal state in which the discharge surface of the discharge unit 40 and the substrate surface are parallel to each other, a discharge outlet interval Nintr and a supply position interval Dintr of the imprint material on the substrate will become equal to each other. In contrast, in a case in which the discharge unit 40 and the substrate W are relatively tilted, the supply position interval Dintr of the imprint material on the substrate tends to increase with respect to the discharge outlet interval Nintr as shown in FIG. 10. For example, letting the discharge outlet interval Nintr be 70 μm and a tilt angle TiltY of the discharge unit (discharge surface) with respect to the substrate surface be 1,000 μrad, the supply position interval Dintr of the imprint material on the substrate is calculated in the following manner.

$$D\text{intr}=70 \text{ μm}\div\cos(1000 \text{ μrad})=70.000035 \text{ μm}$$

That is, when the discharge unit 40 and the substrate W are relatively tilted by 1,000 μrad, the supply position interval Dintr of the imprint material on the substrate increases by 0.000035 μm with respect to the discharge outlet interval Nintr.

Figure 11:
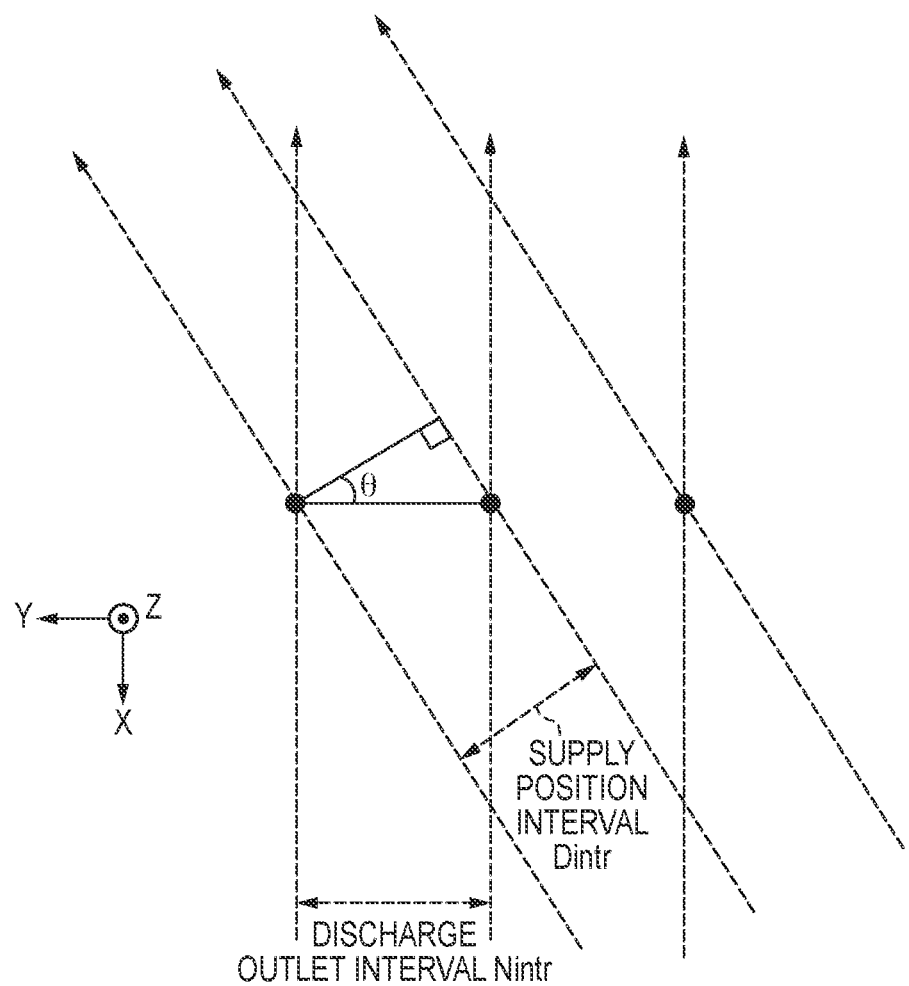
FIG. 11 is a view for explaining the relationship between the discharge outlet interval and the supply position interval of the imprint material on the substrate.

On the other hand, in a case in which the movement direction of the substrate W is changed, the supply position interval Dintr of the imprint material on the substrate tends to decrease with respect to the discharge outlet interval Nintr as shown in FIG. 11. For example, letting the discharge outlet interval Nintr be 70 μm and the angle (the angle difference) θ by which the movement direction of the substrate surface has been changed with respect to the reference direction be 333 μrad, the supply position interval Dintr of the imprint material on the substrate is calculated in the following manner.

$$D\text{intr}=70 \text{ μm}\times\cos(333 \text{ μrad})=69.999996 \text{ μm}$$

That is, when the movement direction of the substrate W is changed with respect to the reference direction by 333 μrad, the supply position interval Dintr decreases by 0.000004 μm with respect to the discharge outlet interval Nintr.

In this case, since the actual interval of the imprint material (droplets) supplied on the substrate is the average of the supply position interval Dintr shown in FIG. 10 and the supply position interval Dintr shown in FIG. 11, the actual supply position interval Dintr of the imprint material on the substrate is calculated in the following manner.

$$D\text{intr}'=(70.000035 \text{ μm}+69.999996 \text{ μm})\div 2=70.0000115 \text{ μm}$$

That is, since the supply position interval Dintr shown FIG. 10 and the supply position interval Dintr shown in FIG. 11 will compensate each other by the method according to this embodiment, the arrangement pitch shift amount with respect to the design value can be sufficiently reduced to 0.0000155 µm.

<Embodiment of Method of Manufacturing Article>

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern on an imprint material supplied (applied) on to a substrate by using the above-described imprint apparatus (imprint method) and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 12A:
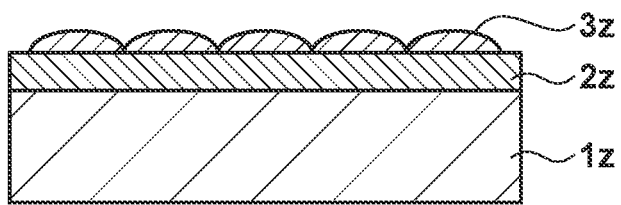
FIGS. 12A to 12F are views showing a method of manufacturing an article.

A detailed method of manufacturing an article will be described next. As shown in FIG. 12A, a substrate $1z$ such as a silicon wafer with a processed material $2z$ such as an insulator formed on the surface is prepared. Next, an imprint material $3z$ is applied to the surface of the processed material $2z$ by an inkjet method or the like. A state in which the imprint material $3z$ is applied as a plurality of droplets onto the substrate is shown here.

Figure 12B:
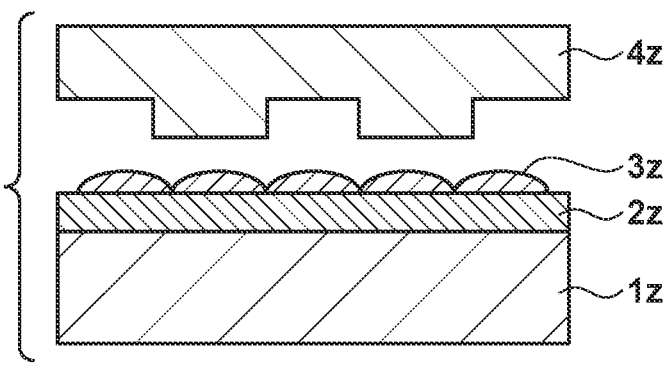
Figure 12C:
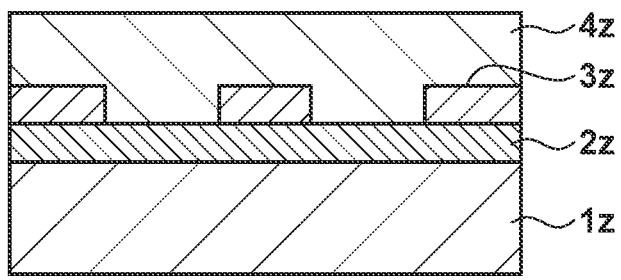

As shown in FIG. 12B, a side of a mold $4z$ for imprint with an uneven pattern is directed to and caused to face the imprint material $3z$ on the substrate. As shown in FIG. 12C, the substrate $1z$ to which the imprint material $3z$ is applied is brought into contact with the mold $4z$, and a pressure is applied. The gap between the mold $4z$ and the processed material $2z$ is filled with the imprint material $3z$. In this state, when the imprint material $3z$ is irradiated with energy for curing through the mold $4z$, the imprint material $3z$ is cured.

Figure 12D:
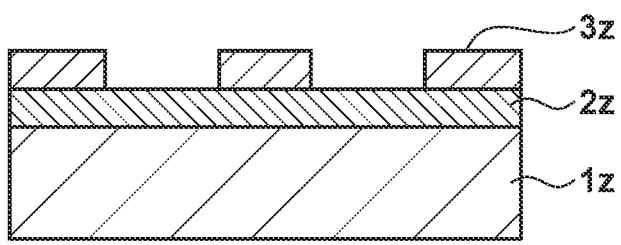

As shown in FIG. 12D, after the imprint material $3z$ is cured, the mold $4z$ is separated from the substrate $1z$. Then, the pattern of the cured product of the imprint material $3z$ is formed on the substrate $1z$. In the pattern of the cured product, the concave portion of the mold corresponds to the convex portion of the cured product, and the convex portion of the mold corresponds to the concave portion of the cured product. That is, the uneven pattern of the mold $4z$ is transferred to the imprint material $3z$.

Figure 12E:
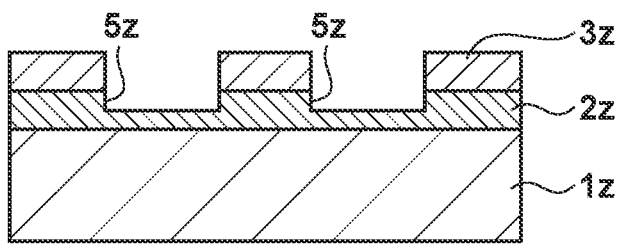
Figure 12F:
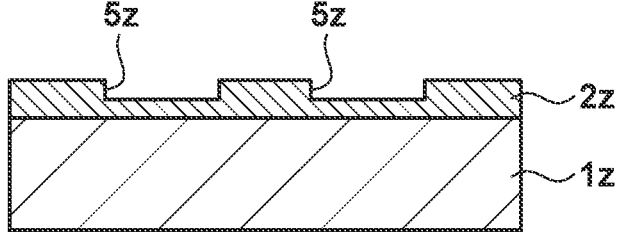

As shown in FIG. 12E, when etching is performed using the pattern of the cured product as an etching resistant mask, a portion of the surface of the processed material $2z$ where the cured product does not exist or remains thin is removed to form a groove $5z$. As shown in FIG. 12F, when the pattern of the cured product is removed, an article with the grooves $5z$ formed in the surface of the processed material $2z$ can be obtained. Here, the pattern of the cured product is removed. However, instead of processing or removing the pattern of the cured product, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-038762 filed on Mar. 4, 2019, which is hereby incorporated by reference herein in its entirety.

What is claimed is:

1. An imprint apparatus that forms a pattern of an imprint material on a substrate by using a mold, comprising:
   a discharge unit on which a plurality of discharge outlets configured to discharge the imprint material as droplets are arranged;
   a measurement unit configured to measure a relative tilt error between the discharge unit and the substrate, the relative tilt error causing a state where distances between the plurality of discharge outlets and the substrate are different from each other; and
   a control unit configured to control a process of causing the discharge unit to discharge the imprint material while moving the substrate with respect to the discharge unit,
   wherein the relative tilt error causes an arrangement error which is an error between an arrangement of droplets of the imprint material discharged from the plurality of discharge outlets onto the substrate by the process and a target arrangement, and wherein the control unit is configured to determine a movement direction in which the substrate is moved with respect to the discharge unit in the process, in accordance with the relative tilt error measured by the measurement unit, so that the arrangement error is reduced.

2. The apparatus according to claim 1, wherein the control unit is configured to:

obtain, as an estimated arrangement, an arrangement of droplets of the imprint material on the substrate estimated when the imprint material is discharged from the plurality of the discharge outlets in a state in which the relative tilt error has occurred, based on the relative tilt error measured by the measurement unit, and determine the movement direction based on the estimated arrangement.

3. The apparatus according to claim 2, wherein the control unit is configured to determine the movement direction so that the arrangement error defined by a difference between the estimated arrangement and the target arrangement is reduced.

4. The apparatus according to claim 2, wherein the control unit is configured to obtain the estimated arrangement based on the relative tilt error measured by the measurement unit and a relative movement velocity between the discharge unit and the substrate used in the process.

5. The apparatus according to claim 4, wherein the control unit is configured to obtain a difference between at least two discharge outlets among the plurality of discharge outlets with respect to a distance from each discharge outlet to the substrate, based on the relative tilt error measured by the measurement unit, and obtain the estimated arrangement based on the obtained difference and the relative movement velocity.

6. The apparatus according to claim 1, wherein the control unit is configured to adjust a rotation of the substrate in the process based on information indicating a target supply positions of droplets of the imprint material on the substrate, so that the droplets of the imprint material are supplied to the target supply positions in a case of moving the substrate with respect to the discharge unit in the determined movement direction.

7. The apparatus according to claim 1, wherein the measurement unit is configured to measure, as the relative tilt error between the discharge unit and the substrate, a relative orientation error between a surface of the substrate and a reference surface of the discharge unit that can define a discharge direction of the imprint material.

8. The apparatus according to claim 7, wherein the reference surface includes a surface of the discharge unit on which the plurality of discharge outlets are arranged.

9. A method of manufacturing an article, the method comprising:

forming a pattern on a substrate using an imprint apparatus; and processing the substrate, on which the pattern has been formed, to manufacture the article, wherein the imprint apparatus forms a pattern of an imprint material pattern on the substrate by using a mold, and comprises:

a discharge unit on which a plurality of discharge outlets configured to discharge the imprint material as droplets are arranged;

a measurement unit configured to measure a relative tilt error between the discharge unit and the substrate, the relative tilt error causing a state where distances between the plurality of discharge outlets and the substrate are different from each other; and a control unit configured to control a process of causing the discharge unit to discharge the imprint material while moving the substrate with respect to the discharge unit, wherein the relative tilt error causes an arrangement error which is an error between an arrangement of droplets of the imprint material discharged from the plurality of discharge outlets onto the substrate by the process and a target arrangement, and wherein the control unit is configured to determine a movement direction in which the substrate is moved with respect to the discharge unit in the process, in accordance with the relative tilt error measured by the measurement unit, so that the arrangement error is reduced.

10. The apparatus according to claim 1, wherein the relative tilt error is an error of a relative tilt between the discharge unit and the substrate with respect to a target relative tilt, and the target relative tilt is the relative tilt in a state where the distances between the plurality of discharge outlets and the substrate are the same.

11. The apparatus according to claim 1, wherein the measurement unit is configured to measure the relative tilt error by measuring a height distribution of a surface of the discharge unit on which the plurality of discharge outlets are arranged, and measuring a height distribution of a surface of the substrate.

12. The apparatus according to claim 1, wherein the control unit is configured to determine the movement direction of the substrate in accordance with the relative tilt error measured by the measurement unit, so that the arrangement error is reduced without moving the discharge unit.

13. The apparatus according to claim 1, wherein the control unit is configured to estimate an angle by which the arrangement of droplets of the imprint material on the substrate changes in accordance with the relative tilt error measured by the measurement unit, and determine, as the movement direction of the substrate, a direction changed from a reference direction by the estimated angle, and the reference direction is a direction in which the substrate should be moved with respect to the discharge unit in the process in a state where the discharge unit and the substrate are arranged at a target relative tilt.

14. The apparatus according to claim 1, wherein the control unit is configured to determine the movement direction of the substrate in accordance with the relative tilt error measured by the measurement unit, so that the arrangement error of droplets the imprint material discharged from the plurality of discharge outlets on the substrate at the same time is reduced.

* * * * *